(12) United States Patent
Su et al.

(10) Patent No.: US 7,262,390 B2
(45) Date of Patent: Aug. 28, 2007

(54) APPARATUS AND ADJUSTING TECHNOLOGY FOR UNIFORM THERMAL PROCESSING

(75) Inventors: Chiung-Chieh Su, Taoyuan (TW); Meng-Chiuan Yu, Taoyuan (TW); Jen-Chieh Tsao, Taoyuan (TW); Ming-June Lin, Taoyuan (TW); Yong-Sen Su, Taoyuan (TW); Yi-Hsiang Lai, Taoyuan (TW)

(73) Assignee: Chung Shan Institute of Science and Technology, Armaments Bureau, M.N.D., Taoyuan County (TW)

( * ) Notice: Subject to any disclaimer, the term of this patent is extended or adjusted under 35 U.S.C. 154(b) by 0 days.

(21) Appl. No.: 11/271,537

(22) Filed: Nov. 9, 2005

(65) Prior Publication Data

US 2006/0291823 A1    Dec. 28, 2006

Related U.S. Application Data

(63) Continuation-in-part of application No. 11/135,850, filed on May 23, 2005, now abandoned.

(51) Int. Cl.
F27B 5/14 (2006.01)
F26B 3/30 (2006.01)

(52) U.S. Cl. .......................... 219/390; 392/418

(58) Field of Classification Search ................ 219/390, 219/405, 411; 392/416, 418; 118/724, 725, 118/50.1; F27B 5/14; F26B 3/30
See application file for complete search history.

(56) References Cited

U.S. PATENT DOCUMENTS 6,108,490 A * 8/2000 Lee et al. ............... 392/416
6,167,195 A * 12/2000 Moslehi et al. ............. 392/418
6,200,634 B1 * 3/2001 Johnsgard et al. ........ 427/248.1
6,343,183 B1 * 1/2002 Halpin et al. ............... 392/416
6,491,757 B2 * 12/2002 Halpin et al. ............... 118/666
6,559,424 B2 * 5/2003 O'Carroll et al. ........... 219/390
6,692,576 B2 * 2/2004 Halpin et al. ............... 118/730
6,818,864 B2 * 11/2004 Ptak ......................... 219/390
7,045,746 B2 * 5/2006 Devine et al. ............. 219/411

OTHER PUBLICATIONS

"Chapter 13, Rapid Thermal Multiprocessing for a Programmable Factory for Manufacturing of 1 Cs" Krishna C. Saraswat / Fred Roozeboom (ed.), Advanceds in Rapid Thermal and Integrated Processing, pp. 375-413, 1996 Kluwer Academic Publishers, Printed in the Netherlands.

* cited by examiner

*Primary Examiner*—Daniel Robinson
(74) *Attorney, Agent, or Firm*—Rosenberg, Klein & Lee

(57) ABSTRACT

An adjusting technology of thermal processing is provided. A heating lamp and a reflector are disposed over a wafer and the heat flux distribution on the wafer generated by the individual heating lamp is measured and adjusted. A set of heating lamps formed by heating lamps is disposed over the wafer. The heating lamps are in concentric rings and arranged as an axi-symmetric array. The relative position between the set of heating lamps and the wafer is adjusted so that the wafer center is at the position with local mean heat flux from lamps between the most inner lamp subset and its adjacent lamp subset. Followed by adjusting the heating powers, either or both of the wafer and the set of heating lamps are rotated respect to the center of the wafer, so as to improve uniformity of the heat flux distribution on the heated object.

17 Claims, 6 Drawing Sheets

APPARATUS AND ADJUSTING TECHNOLOGY FOR UNIFORM THERMAL PROCESSING

CROSS-REFERENCE TO RELATED APPLICATION

This application is a continuation-in-part of a prior application Ser. No. 11/135,850, filed May 23, 2005 now abandoned. All disclosures are incorporated herewith by reference.

BACKGROUND OF THE INVENTION

1. Field of Invention

The present invention relates to an apparatus and an adjusting technology for a uniform thermal processing and particularly for uniformly heating wafers.

2. Description of the Related Art

Along with the advances of science and technology and the steady enhancement of living quality plus the continuously growing of computers and the peripheral industries thereof, the IC (integrated circuit) application fields are wider and wider. As to the IC devices in current applications, the silicon wafers are used as the base material for the most IC substrates. On a wafer, a number of semiconductor processes, such as layer deposition, lithographing, etching, removing the photoresist, and followed by packaging and testing, etc. are performed to accomplish the IC device fabrication.

In the above-mentioned semiconductor processes, especially in thermal annealing and thermal oxidizing processes, "temperature" is one of the most important production parameters. A lately developed "rapid thermal processing" (RTP) provides an effective and efficient thermal processing for the wafers. In this thermal processing technology, however, one of the critical issues is how to reach a uniform temperature distribution within a wafer as well as from wafer to wafer.

FIG. 1A is a simplified cross-sectional view, schematically showing a conventional thermal processing apparatus. FIG. 1B is a plan view, schematically showing a set of heating lamps in FIG. 1A. Referring to FIG. 1A and FIG. 1B, a conventional thermal processing apparatus 100 mainly comprises a chamber 110, a supporter 120 and a set of heating lamps 130. Wherein, the supporter 120 and the set of heating lamps 130 are disposed inside the chamber 110 and are separated by a thermally transparent plate 140, such as a quartz plate. The set of heating lamps 130 locates above the supporter 120 and comprises a plurality of heating lamps 132 and reflectors 134. A wafer 10 is placed on the supporter 120. The set of heating lamps 130 is used for heating the wafer 10.

Prior to heating the wafer 10, an individual heating lamp 132 and the appropriate reflector 134 thereof must be adjusted to get a certain heat flux distribution on the wafer 10 to meet the requirements of the conventional thermal processing process. In general, by controlling the distance between the heating lamp 132 and the wafer 10, the shape of the reflector 134 and the heating power applied to the heating lamp 132, a desired contribution by an individual heating lamp 132 on the overall heat flux distribution of the wafer 10 will be obtained. In this way, the individual heating lamp adjustment is completed.

Next, according to the heat flux distribution on the wafer 10 by an individual heating lamp 132, the overall heat flux distribution on the wafer 10 by a set of heating lamps 130 is thus estimated. Since the wafer 10 is in a disk shape, these heating lamps 132 are arranged in an axi-symmetric array to form a set of heating lamps 130 as shown in FIG. 1B. Remarkably, the local area of the wafer 10 right under the heating lamp 132 receives a local maximum heat flux due to the relatively shortest distance between the heat source and the heated spot. On the other hand, the area of the wafer 10 farther away from the heating lamp 132 therefore receives a lower heat flux. Accordingly, it is very hard to meet a uniform requirement of the heat flux distribution on the wafer 10.

To make the heat flux distribution on the wafer 10 uniform, a rotatable design of a supporter 120 with a proper velocity was developed. Thus, the heat flux distribution on wafer 10 along a circumferential direction is relatively uniform. FIG. 2 illustrates the heat flux distribution on a wafer with the rotating supporter in a conventional thermal processing apparatus. In FIG. 2, the chart of heat flux distribution on the wafer 10, the abscissa represents radial positions on the wafer 10 (in unit of cm), the ordinate represents the heat fluxes received on the wafer 10 (in unit of $W/cm^2$), and the zero value of abscissa represents the center of the wafer 10.

Referring to FIG. 1B and FIG. 2, the local area, on the upper surface of wafer 10 and between two adjacent rings of heating lamps 132, is a non-perpendicular incidence zone and the heat flux thereon is relatively lower. Even if the wafer 10 rotates, the accumulated heat density on this non-perpendicular incidence zone is still lower than that on the zone right under the heating lamp 132. The wafer 10 with a proper rotating velocity may get a relatively uniform heat flux distribution along a circumferential direction (P-direction shown in FIG. 1B). Along the radial direction of the wafer 10 (R-direction shown in FIG. 1B), however, the heat flux distribution thereon still has a big fluctuation. As shown in FIG. 2, the fluctuating amplitude is about ±5%. The so-called "fluctuating amplitude" herein means (peak value−average value)/average value.

Thus, excessive fluctuating amplitude of heat flux distribution on a wafer will produce a thermal stress. It may cause dislocation and crossover, i.e. bare wire connection in the IC. In addition, it may also cause a discrepant chemical-reaction rate on the wafer or from wafer to wafer. All those will reduce the production yield of wafers in company with an increased production cost. Along with the tendency of larger-size wafer and tinier-size IC, the problems due to excessive temperature non-uniformity in a wafer would become more serious and worse.

SUMMARY OF THE INVENTION

An objective of the present invention is to provide an adjusting technology for a thermal processing process suitable for uniformly heating wafers and to increase the production yield of wafers with reduced production cost.

Another objective of the present invention is to provide a thermal processing apparatus suitable for uniformly heating wafers to increase the production yield of wafers with reduced production cost.

The present invention provides an adjusting technology for a thermal processing, which at least comprises a plurality of steps as follows. Firstly, a set of heating lamps formed by a plurality of heating lamps is disposed above an object to be heated, which is also known as a heated object. Wherein, the heating lamps are arranged as an axi-symmetric array of a plurality of concentric rings. The interval between two adjacent rings may be determined from the viewpoint of uniform irradiance. Then, the set of heating lamps and the heated object are disposed with a horizontal offset such that the object center is at the position with local mean heat flux from lamps between the most inner lamp subset and its adjacent lamp subset. Basically, the offset is directional, i.e. a vector. Subsequently, the power of heating lamp is adjusted in the manner that the heating lamps located at the same concentric ring are heated with the same power, but the powers for different rings of heating lamps are according to a setting ratio. Then, the heated object rotates about the centerline thereof. Adjusting the offset, the local areas of the heated object may pass through the position right under the ring of lamps with local maximum irradiance, and then pass through the position between two adjacent rings of lamps with local minimum irradiance, and eventually will be back to its original position. This phenomenon should occur at least once per revolution. The improvement of uniform irradiance on the heated object can thus be achieved. However, the rotary one may be the set of lamps or the heated body or the both as well.

According to the adjusting technology for the thermal processing in an embodiment of the present invention, prior to designing a set of heating lamps over the heated object, the thermal processing further comprises a step for measuring and adjusting the heat flux distribution produced by a individual heating lamp. Based on these heat flux distributions, the overall heat flux distribution contributed by the set of all heating lamps is calculated.

According to the adjusting technology for the thermal processing process in an embodiment of the present invention, the heated object is, for example, a disk-like object such as a wafer and the heating lamp is, for example, of the type of bulb. Besides, the set of heating lamps is arranged in the form of 6 concentric rings with the interval in a ratio of 4/3:1.5:2:2:2. The first ring of heating lamps is located at the center and the sixth ring of heating lamps is located at the outer edge. If the offset distance is denoted by e, then, the distance between the first ring of heating lamps and the second ring of heating lamps is L1=4e/3, the distance between the second ring of heating lamps and the third ring of healing lamps is L2=1.5e. The distance between the third ring of heating lamps and the fourth ring of heating lamps is L3=2e. The distance between the fourth ring of heating lamps and the fifth ring of heating lamp is L4=2e. The distance between the fifth ring of heating lamp and the sixth ring of heating lamp is L5=2e. If the diameter of the heated object is D, the offset distance e can be calculated by a formula, $$D/2 = \sum_{i=1}^{5} Li - e - X.$$

In general, the value of X is 0.3 cm and it is the design tolerance because of no chip fabricated at the outer edge of a wafer.

According to the adjusting technology for a thermal processing in an embodiment of the present invention, the offset angle is 15° as shown in FIG. 3C. When D=30 cm, the powers for the first ring of heating lamps through the sixth ring are in the ratio of 31:36:57:71:65:99, respectively.

The present invention further provides a thermal processing apparatus suitable for heating an object. The thermal processing apparatus comprises a chamber, a rotatable supporter and a set of heating lamps. Wherein, the rotatable supporter is disposed inside the chamber, the heated object is placed on the rotatable supporter and the set of heating lamps is disposed inside the chamber and over the rotatable supporter. The set of heating lamps comprise a plurality of heating lamps, which are arranged as an axi-symmetric array of a plurality of concentric rings. The above-mentioned concentric rings are arranged with appropriate intervals. The rotation center of the heated object is shifted from the concentric rings' center by an offset, a determined vector, so that the object center is at the position with local mean heat flux from lamps between the most inner lamp subset and its adjacent lamp subset. In other words, the center of the rings of heating lamps and the rotation center of heated object are not at the same position. Adjusting the offset, the local areas of the heated object may pass through the position right under the ring of lamps with local maximum irradiance, and then pass through the position between two adjacent rings of lamps with local minimum irradiance, and eventually will be back to its original position. This phenomenon should occur at least once per revolution. The improvement of uniform irradiance on the heated object can thus be achieved.

The present invention further provides another thermal processing apparatus suitable for heating a heated object. The thermal processing apparatus comprises a chamber, a supporter and a rotatable set of heating lamps. Wherein, the supporter is disposed inside the chamber, the heated object is placed on the supporter and the rotatable set of heating lamps is disposed inside the chamber and above the supporter. The rotatable set of heating lamps comprises a plurality of heating lamps, which are arranged as an axi-symmetric array of a plurality of concentric rings. The above-mentioned concentric rings are arranged with an appropriate interval between adjacent two concentric rings. The rotatable set of heating lamps has an array center. The center of heated object is shifted from the center of concentric rings by an offset, which is a determined vector. For heating the object, the set of heating lamps rotates not about its own centers but about the center of the heated object. Adjusting the offset, the local areas of the heated object may pass through the position right under the ring of lamps with local maximum irradiance, and then pass through the position between two adjacent rings of lamps with local minimum irradiance, and eventually will be back to its original position. This phenomenon should occur at least once per revolution. The improvement of uniform irradiance on the heated object can thus be achieved. In general, the rotary one may be the set of lamps or the heated body or the both as well.

According to the thermal processing apparatus in an embodiment of the present invention, the heated object is, for example, a disk-like object such as a wafer, and the heating lamps are, for example, arranged in several concentric rings. Besides, the number of the concentric rings is preferable 6, wherein the first one is a single heating lamp at the center. The intervals between each two adjacent concentric rings from inner to outer are preferably in an interval ratio of 4/3:1.5:2:2:2. If the offset distance is denoted by e, then, the distance between the first ring and the second ring is L1=4e/3. The distance between the second ring and the third ring is L2=1.5e. The distance between the third ring and the fourth ring is L3=2e. The distance between the fourth ring and the fifth ring is L4=2e. The distance between the fifth ring and the sixth ring is L5=2e. If the diameter of the heated object is D, the offset distance e can be calculated by a formula, $$D/2 = \sum_{i=1}^{5} Li - e - X.$$

In general, the value of X is 0.3 cm and it is the design tolerance because of no chip fabricated at the outer edge of a wafer.

According to the thermal processing apparatus in an embodiment of the present invention, the offset angle is 15° as shown in FIG. 3C. When D=30 cm, the powers for the first set of heating lamps through the sixth set are in the ratio of 31:36:57:71:65:99, respectively.

According to the thermal processing apparatus in an embodiment of the present invention, the supporter is a wafer supporter.

In the above-described adjusting technology and apparatus for thermal processing of the present invention, the following novel measures are applied. At first, the heat flux distribution generated by an individual heating lamp is obtained by, for example, measurement. Selecting a proper arrangement of the set of heating lamps, the appropriate intervals between two concentric rings of heating lamps are subsequently determined. Finally the offset between the center of the heated object and the center of the set of heating lamps, and the heating powers for the rings of the heating lamps are adjusted and controlled. Due to relative eccentric rotation of the set of heating lamps with respect to the center of heated object and, an improvement in uniformity for the heat flux distribution on the surface of the heated object can be effectively achieved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

The First Embodiment

Figure 1A:
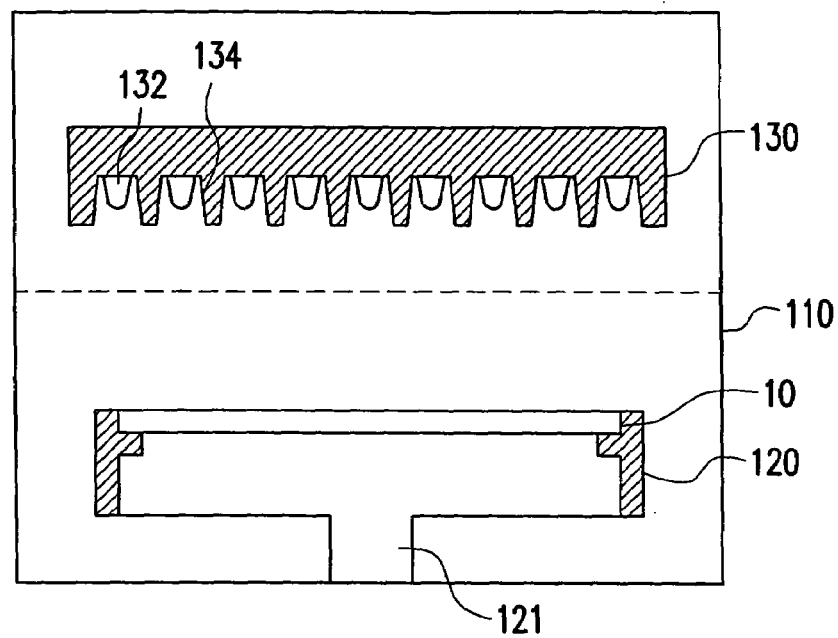
FIG. 1A is a schematic cross-sectional view of a conventional thermal processing apparatus.
Figure 1B:
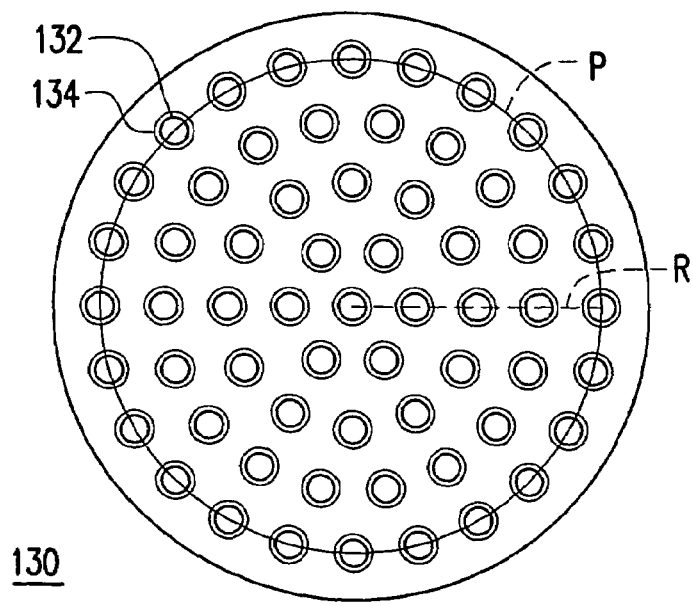
FIG. 1B is a schematic plan view of the set of heating lamps in FIG. 1A.
Figure 2:
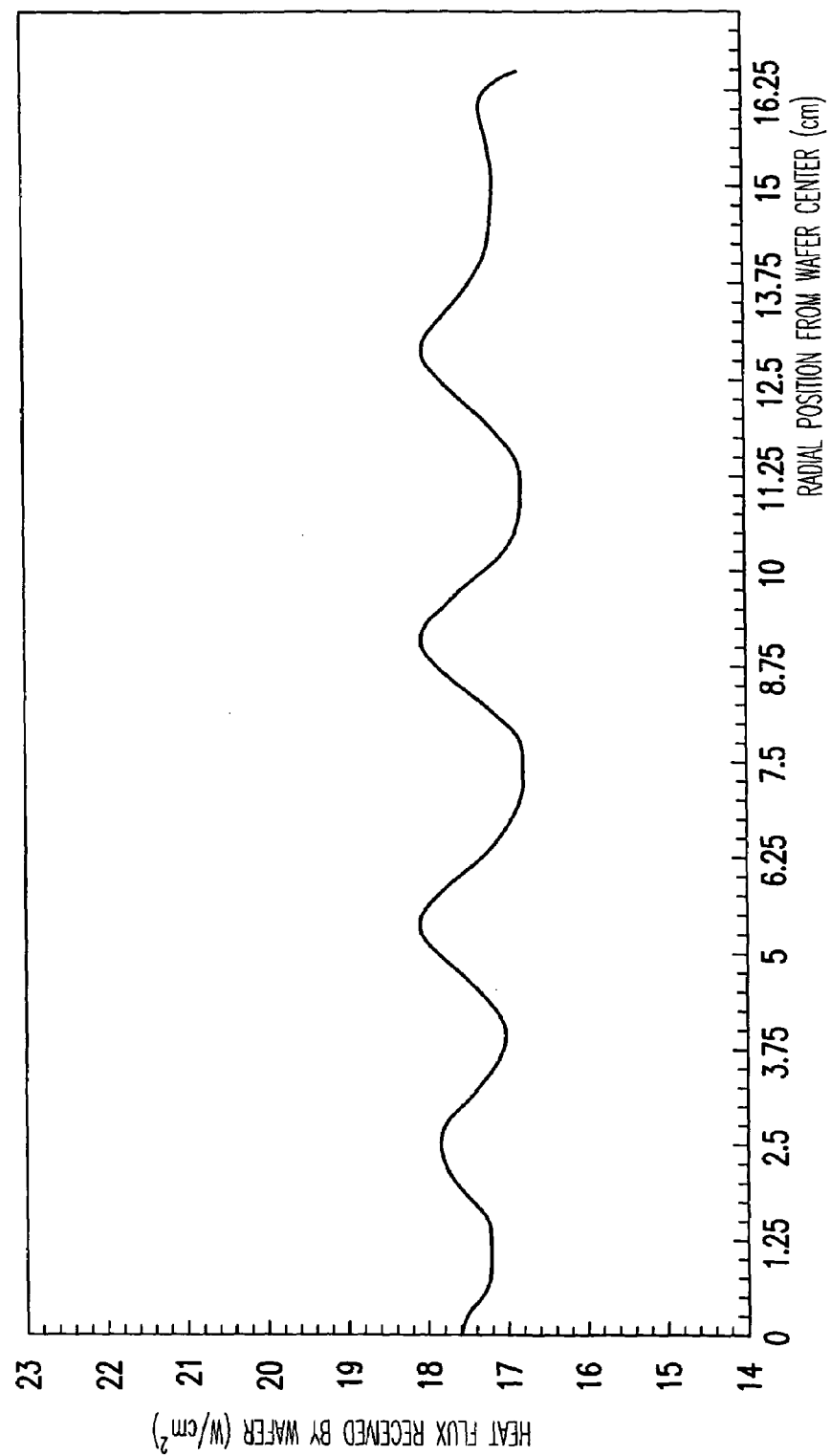
FIG. 2 schematically illustrates a heat flux distribution on a wafer after the rotating process in a conventional thermal processing apparatus.
Figure 3A:
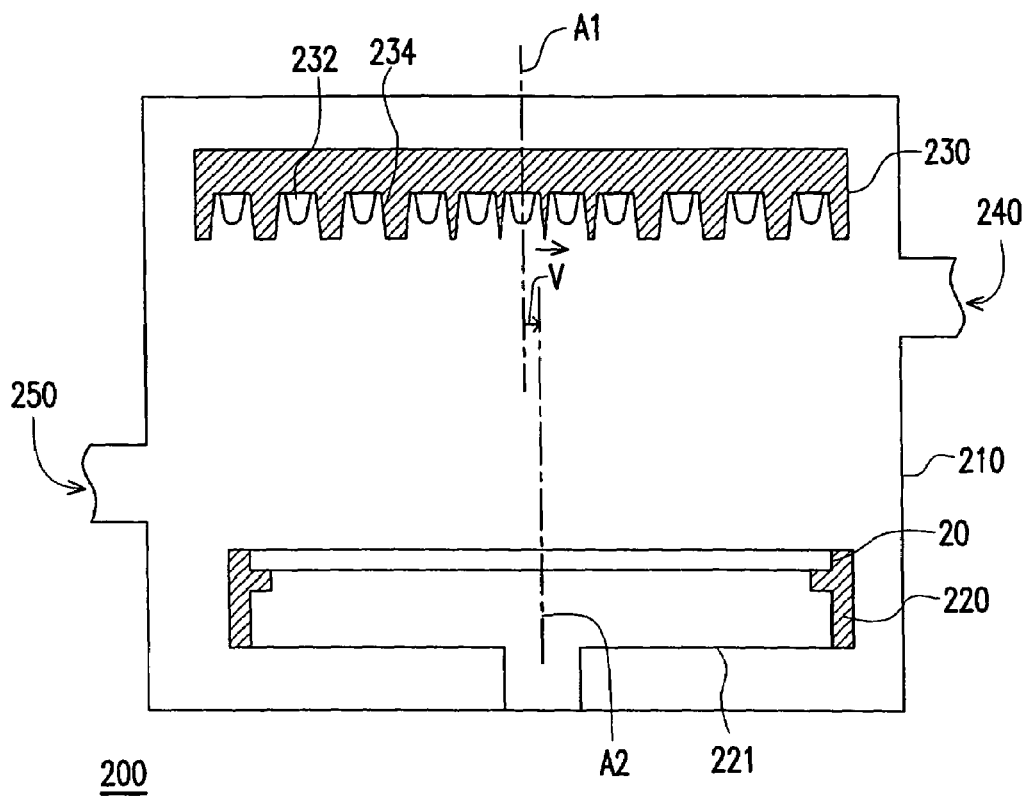
FIG. 3A is a schematic cross-sectional view, schematically illustrating a thermal processing apparatus according to the first embodiment of the present invention.
Figure 3B:
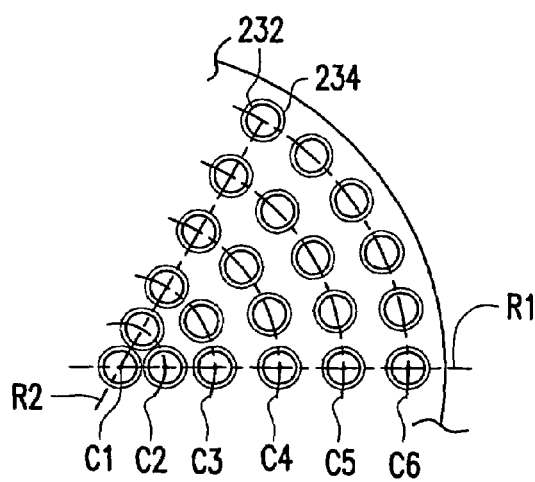
FIG. 3B is a drawing, schematically showing a partial plan view of the set of heating lamps in FIG. 3A.

FIG. 3A is a schematic cross-sectional view of a thermal processing apparatus in the first embodiment of the present invention. FIG. 3B is a drawing, schematically showing a partial plan view of the set of heating lamps in FIG. 3A. Referring to FIGS. 3A and 3B, a thermal processing apparatus 200 of the present invention comprises, for example, a chamber 210, a rotatable supporter 220, a set of heating lamps 230, a gas intake 240 and an exhaust outlet 250. Wherein, the rotatable supporter 220, such as a wafer supporter, and the set of heating lamps 230 are disposed inside the chamber 210, and the set of heating lamps 230 is located over the rotatable supporter 220. The centerline A2 of object 20 is parallel to the array centerline A1 of the set of heating lamps 230. The set of heating lamps 230 comprises a plurality of heating lamps 232 and reflectors 234, and the heating lamps 232 are, for example, infrared halogen lamps. A heated object 20 is placed on the rotatable supporter 220 and heated by the set of heating lamps 230. In the embodiment, the heated object 20 is, for example, a disk-like wafer. For conveniently controlling the set of heating lamps 230 that formed by a plurality of the heating lamps 232 and the reflectors 234 to generate a desired heat flux distribution on the heated object 20, the heating lamps 232 are installed in, for example, a cone-shaped reflectors 234, and the set of heating lamps 230 is, for example, disk-like (or short cylinder-like). The gas intake 240 and the exhaust outlet 250 are disposed at both sides of the chamber 210, respectively. Wherein, the gas intake 240 is used for inputting a reaction gas needed in a semiconductor process, and the exhaust outlet 250 is used for exhausting out the reacted gas.

Referring to FIGS. 3A and 3B, an adjusting technology for a thermal processing of the present invention comprises, for example, several steps as follows. The heat flux distribution on the heated object 20 generated by an individual heating lamp is obtained by measuring and adjusting the individual heating lamp 232 together with the reflector 234 thereof. To get an intended result of the overall heat flux distribution on the heated object 20 generated by a plurality of individual heating lamps 232 together with the reflectors 234 thereof, a numerical calculation of superposition method is made. Wherein, the calculation step can be conducted with experimentation. Next, the heated object 20 is placed in the above-described thermal processing apparatus 200. Wherein, the set of heating lamps 230 is formed by a plurality of the individual heating lamps 232. The heated object 20 is, for example, a disk-like wafer. For 30 cm$^{\Phi}$ heated object and 1.58 cm$^{\Phi}$ heating lamps, a set of heating lamps 232 is axi-symmetrically arranged, for example, as six concentric rings, C1, C2, C3, C4, C5 and C6. The C1 is usually formed from a single lamp as a center. The intervals between two adjacent concentric rings are in a ratio of, for example, 4/3:1.5:2:2:2 from the inner to the outer. In the embodiment, the ring C1 is the center of the set of heating lamps 230. The radial lines R1 and R2 are the diameter extension lines of the set of heating lamps.

Figure 3C:
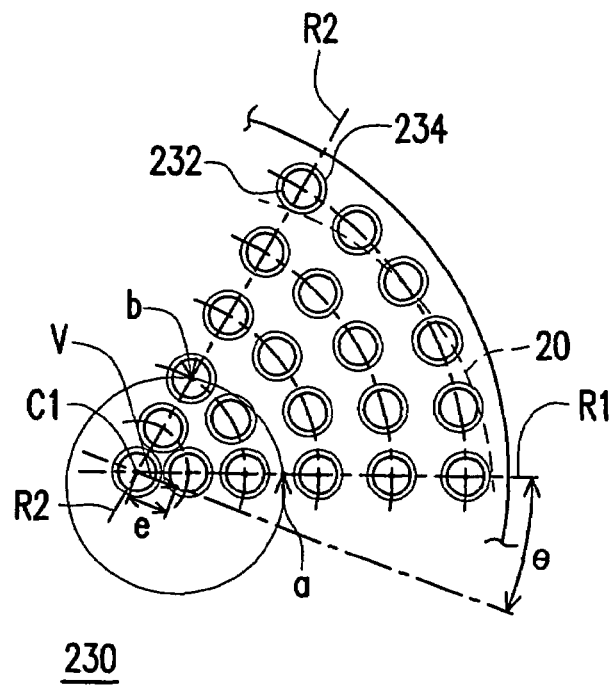
FIG. 3C is a drawing, schematically showing a partial plan view of the relative position between the set of heating lamps and the heated object with offset in FIG. 3A.

FIG. 3C is a drawing, schematically showing a partial plan view of the set of heating lamps 230 with the relative position of the heated object in FIG. 3A. Referring to FIGS. 3A and 3C and the above-described steps, the disposition of the set of heating lamps 230 and the heated object 20 are adjusted so that a desired horizontal offset, represented by a vector V, between the array centerline A1 of the set of heating lamps 230 (i.e. the center of the ring C1) and the centerline A2 of the rotatable object 20 is obtained. Wherein, the offset V is with a directional angle θ, for example 15°, and an offset distance e.

Figure 3D:
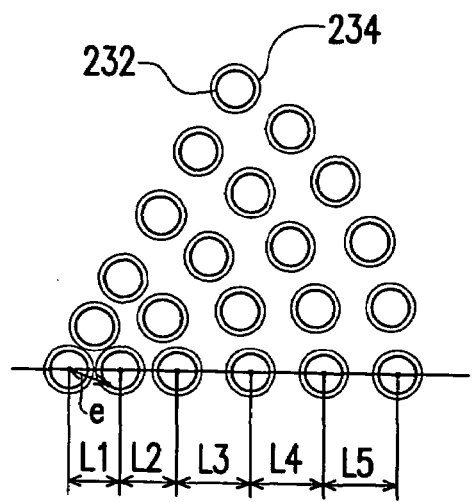
FIG. 3D is a drawing, schematically showing a partial plan view of the set of heating lamps with intervals between two adjacent rings of heating lamps in FIG. 3A.

FIG. 3D is a drawing, schematically showing a partial plan view of the set of heating lamps with intervals between two adjacent rings of heating lamps in FIG. 3A. Referring to FIGS. 3A and 3D, since the offset distance is denoted by e, then the distance between the ring C1 and the ring C2 is L1=4e/3, the distance between the ring C2 and the ring C3 is L2=1.5e, the distance between the ring C3 and the ring C4 is L3=2e, the distance between the ring C4 and the ring C5 is L4=2e and the distance between the ring C5 and the ring C6 is L5=2e. The quantity of e is, for example, 1.953 cm. If the diameter of the heated object 20 is D, the offset distance e can be calculated by a formula, $$D/2 = \sum_{i=1}^{5} Li - e - X.$$

In general, the value of X is 0.3 cm and it is the design tolerance because of no chip fabricated at the outer edge of a wafer.

Referring to FIGS. 3A and 3B, after the above-described steps, by adjusting the heating powers, the rings C1, C2, C3, C4, C5 and C6 of heating lamps 232 are with various power ratios respectively. Wherein, if D=30 cm the power ratios are 31:36:57:71:65:99. Moreover, the powers for the rings C1, C2, C3, C4, C5 and C6 can be controlled by, for example, PID (proportional integration differentiation) mode. Then, the heated object 20 rotates around the centerline thereof. This is equivalent to that the set of heating lamps 230 eccentrically rotates relatively to the heated object 20 due to the effect from the offset V. Referring to FIG. 3C, by adjusting the offset V, the local areas of the heated object 20 can preferably pass regions of local maximum irradiance (shown as the position b in FIG. 3C) and local minimum irradiance during rotation. In comparison with the conventional thermal processing apparatus 100, in the thermal processing apparatus 200 of the present invention, the heated object 20 rotates with an offset in a constant velocity. Besides, the ratios of intervals between adjacent concentric rings and the heating powers of the rings of heating lamps 232 are controlled. In this way, the heated object 20 in the thermal processing apparatus of the present invention is able to receive uniform heat fluxes from the set of heating lamps 230.

The Second Embodiment

Figure 4:
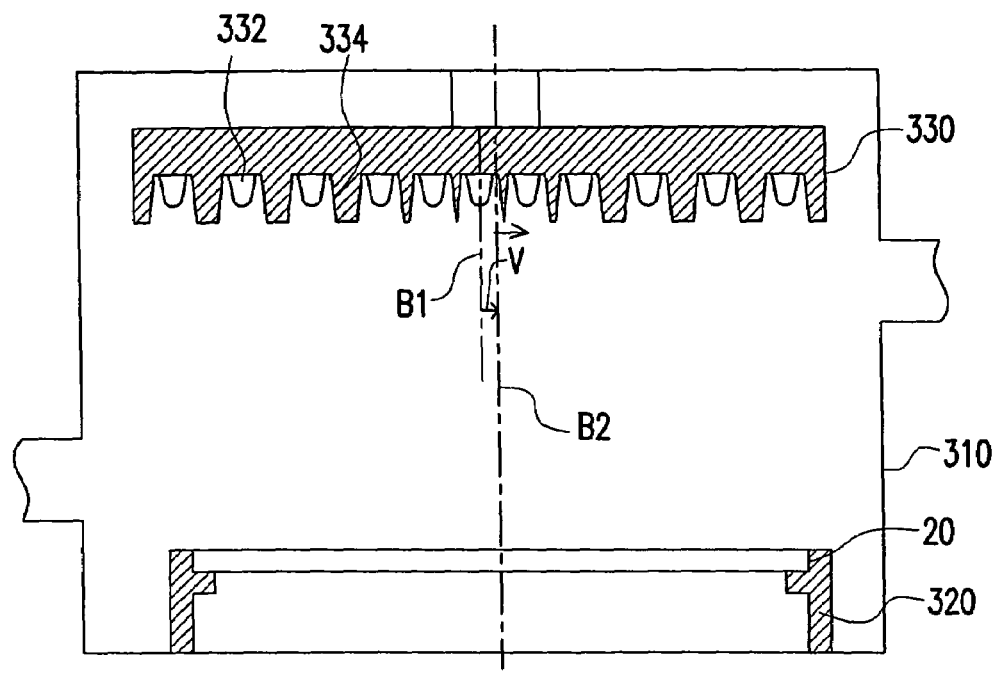
FIG. 4 is a cross-sectional view, schematically illustrating a thermal processing apparatus according to a second embodiment of the present invention.

FIG. 4 is a cross-sectional view, schematically illustrating a thermal processing apparatus according to a second embodiment of the present invention. Unlike the above-described thermal processing apparatus 200 in the first embodiment, the set of heating lamps of the thermal processing apparatus 300 in the second embodiment is rotatable, and the supporter 320 of the thermal processing apparatus 300 is not rotated. Remarkably, the offset V is also arranged. The set of heating lamps 330 rotates eccentrically around the centerline B2 of the heated object. This is equivalent to that the heated object 20 rotates about the centerline B2 thereof and with an offset as shown in the first Embodiment. As to the other components and the relative positions thereof of the thermal processing apparatus 300 are the same as those in the first embodiment, so descriptions for the other components are omitted for simplicity. In the same way as the first embodiment of the present invention, the heated object 20 receives a uniform heat flux from the rotating set of heating lamps 330 by adjusting the ratio of interval between rings, the offset distance e, the offset angle θ and the heating powers of the rings of heating lamps 332.

The Third Embodiment

Figure 5:
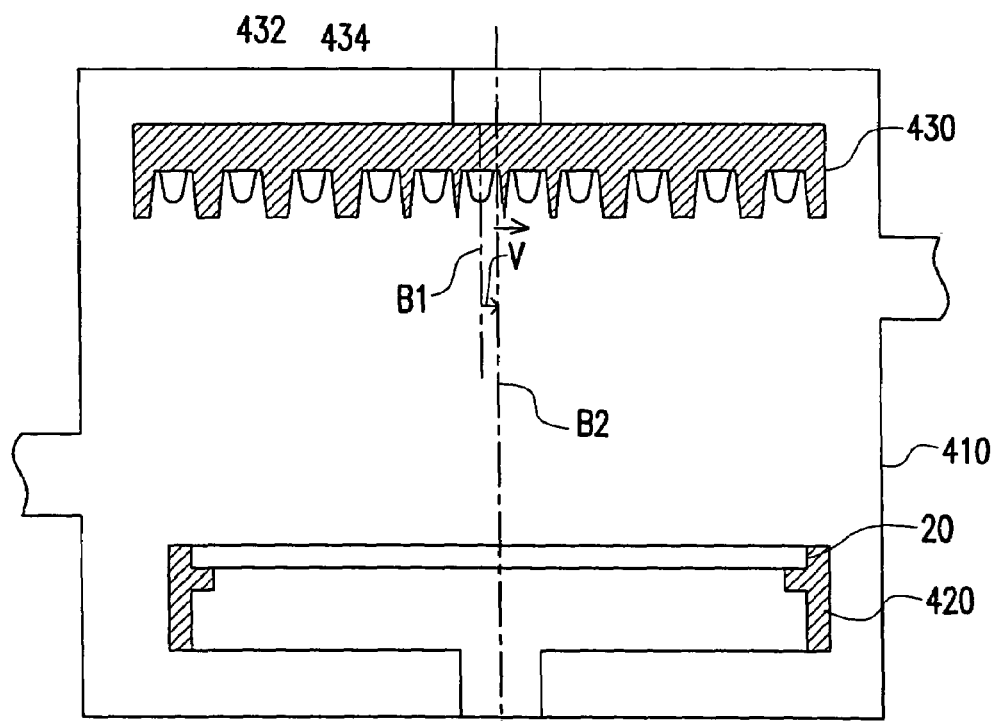
FIG. 5 is a cross-sectional view, schematically illustrating a thermal processing apparatus according to a third embodiment of the present invention.

FIG. 5 is a schematic section view of a thermal processing apparatus in the third embodiment of the present invention. Unlike the above-described thermal processing apparatus 200 in the first embodiment, the set of heating lamps of the thermal processing apparatus 400 in the third embodiment is also rotatable. In other words, both the set of heating lamps 430 and the heated objected 20 are all in rotation. One possibility is that the heated object 20 rotates about the centerline B2 thereof and the set of heating lamps 430 rotates eccentrically about the centerline B2 of heated object 20 as well. As a result, a relative eccentric rotation of the set of heating lamps 430 with respect to the heated objected 20 is achieved. As to the other components and the relative positions thereof of the thermal processing apparatus 400 are the same as those in the first embodiment, so the descriptions of the other components are omitted for simplicity. In the same way as the first embodiment of the present invention, the heated object 20 receives a uniform heat flux from the relatively rotating set of heating lamps 430 by adjusting the ratio of interval between concentric rings, the offset distance e, the offset angle θ and the heating powers of the rings of heating lamps 432.

Figure 6:
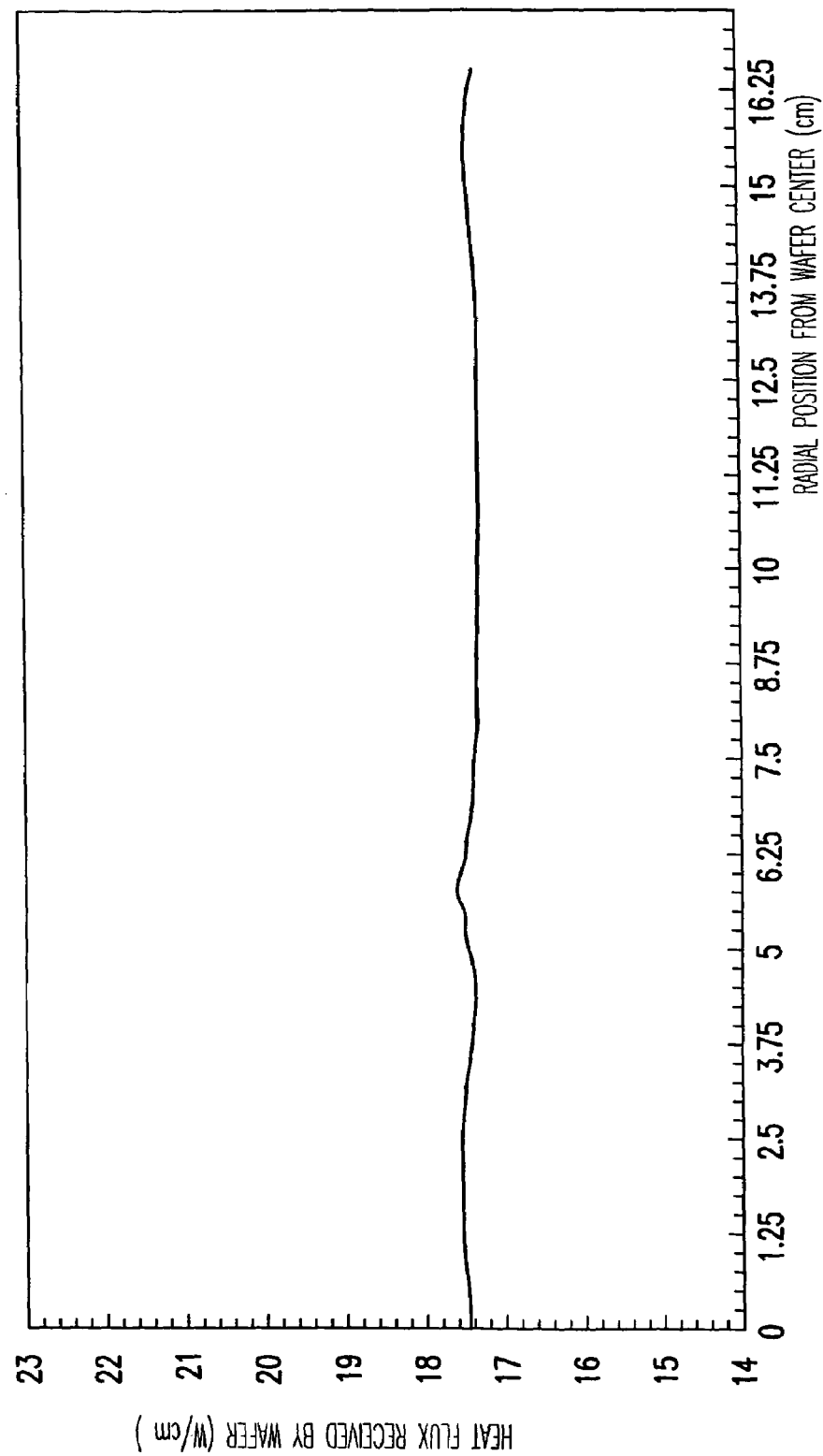
FIG. 6 illustrates a heat flux distribution of a rotating wafer with offset in a thermal processing apparatus of the first embodiment.

A heat flux distribution under the eccentric rotation according to the present invention is shown in FIG. 6. It schematically illustrates the heat flux distribution on a wafer after the eccentrically rotating in a thermal processing apparatus of the first embodiment. In FIG. 6, the abscissa represents radial position on a wafer (in unit of cm), the ordinate represents the received heat flux on the wafer (in unit of W/cm$^2$), and the zero value of the abscissa represents the center position of the heated object 20 (for example, the wafer).

Referring to FIGS. 3A and 6, the heated object 20 is a disk-like wafer with a diameter of, for example, 30 cm and each heating lamp 232 has a diameter of 1.58 cm. The heating lamps are located at six concentric rings, C1, C2, C3, C4, C5 and C6, to form the set of heating lamps 230 with six subsets. The subsets are the rings of heating lamps and with the intervals of L1=4e/3, L2=1.5e, L3=2e, L4=2e and L5=2e. Taking the offset angle θ=15°, the offset distance e can be calculated from the formula $$D/2 = \sum_{i=1}^{5} Li - e - X = 0.7833e - 0.3 \text{(cm) to get } e = 1.953 \text{ cm}.$$

After setting the offset distance e, the heating powers are also adjusted subsequently. The heating power applied to each heating lamp at the same concentric ring is basically the same. For D=30 cm, and six concentric rings, the heating powers applied to the individual concentric ring are in a ratio of 31:36:57:71:65:99, respectively. In the process with the above-described adjustments, a generated heat flux distribution is obtained in FIG. 6. It indicates that the adjusting technology and the apparatus for thermal processing of the present invention are very effectively to obtain a uniform heat flux distribution on a heated object 20 (for example, a wafer). As shown in FIG. 6, the fluctuating amplitude of heat flux distribution on the heated object 20 is reduced to only about ±0.5%. The so-called "fluctuating amplitude" herein means (peak value−average value)/average value.

Since the relative rotation between the heated object 200 and the set of heating lamps 330 in $2^{nd}$ embodiment and the $3^{rd}$ embodiment are similar to that in the $1^{st}$ embodiment, the efficiencies similar to that in the first embodiment are verified for the thermal processing apparatus 300 in the second embodiment and the thermal processing apparatus 400 in the third embodiment. That is, the fluctuating amplitude of heat flux distribution on the heated object 20 may be reduced quite much as well.

Remarkably, the object shape to be heated in the adjusting technology and the apparatus for thermal processing of the present invention is not limited to a disk-like shape; it can have other shapes. Further, the heated object is not limited to a wafer; it can be other suitable material to be heated. Therefore, the adjusting technology and the apparatus for thermal processing of the present invention are not limited to the semiconductor processes; they are suitable for thermal processes of other material as well. In addition, the number of the rings of heating lamps is determined by the diameter of heating lamps and the size of the heated object. Thus, the number of the rings of heating lamps is not limited to "six" only, it can be other numbers (for example, a number larger or smaller than six). The ratio of ring interval corresponding to the heating lamps accordingly is 4/3:1.5:2:2:2:2 . . . 2, wherein " . . . " represents "2". Besides, the set of heating lamps in the adjusting technology and the apparatus for thermal processing of the present invention is not limited to be disposed at one side of a heated object only; it can be two sets and disposed at both sides of a heated object, respectively. All these alternatives still belong to the scope protected by the present invention.

To sum up, the adjusting technology and the apparatus for thermal processing of the present invention are distinguished from the conventional thermal processing apparatuses by the following features. Firstly, the heat flux distribution generated by an individual heating lamp is obtained by, for example, measurement. Secondly, a proper arrangement of the set of heating lamps is selected and adjusted. Thirdly, the offset between the center of the heated object and the center of the set of heating lamps is adjusted. Due to this offset, the heated object and the set of heating lamps are relatively moved in a way of eccentric rotation.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A thermal processing, comprising:
    disposing a heated object on a supporter, wherein the heated object is an object to be heated and has an object center;
    disposing a set of heating lamps formed by a plurality of heating lamps over the heated object, wherein the heating lamps are arranged in a plurality of subsets of the heating lamps respectively forming a plurality of radially-spaced concentric rings, wherein the set of the heating lamps has a lamp center, wherein the object center and the lamp center are shifted one from the other by an offset e such that the object center is at a position with local mean heat flux from lamps between a most inner lamp subset and its adjacent lamp subset;
    applying heating powers to the heating lamps for heating the heated object, wherein an individual one of the same subset of the heating lamps is applied with the same heating power; and
    performing a relative rotation between the heated object and the set of the heating lamps, wherein the relative rotation is eccentric and caused from the offset between the object center and the lamp center such that local areas of the heated object pass through the position under the ring of lamps with local maximum irradiance, and then pass through a position between two adjacent rings of lamps with local minimum irradiance.

2. The thermal processing as recited in claim 1, wherein the relative rotation is one selected from the group consisting of rotating the heated object about the object center while the set of the heating lamps is still, rotating the set of the heating lamps about the object center while the heated object is still, and rotating the heated object about the object center while the set of the heating lamps rotates about the heated object center as well.

3. The thermal processing as recited in claim 1, before the step of disposing the set of the heating lamps, further comprising obtaining a heat flux for an individual one of the heat lamps for determining positions of the heating lamps.

4. The thermal processing as recited in claim 1, wherein the shape of the heated object comprises a disk shape.

5. The thermal processing as recited in claim 1, wherein the heated object comprises a wafer.

6. The thermal processing as recited in claim 1, wherein the number of the subsets of the heating lamps is 6, including a most inner subset with single one of the heating lamps at the lamp center.

7. A thermal processing method comprising:
    disposing a heated object on a supporter, wherein the heated object is an object to be heated and has an object center;
    disposing a set of heating lamps formed by a plurality of heating lamps over the heated object, wherein the heating lamps are arranged into an axi-symmetric array with a plurality of subsets of the heating lamps, wherein the set of the heating lamps has a lamp center, wherein the object center and the lamp center are shifted by an offset e such that the object center is at a position with local mean heat flux from lamps between a most inner lamp subset and its adjacent lamp subset;
    applying heating power to the heating lamps for heating the heated object, wherein an individual one of the same subset of the heating lamps is applied with the same heating power; and
    performing a relative rotation between the heated object and the set of the heating lamps, wherein the relative rotation is eccentric and caused from the offset between the object center and the lamp center such that local areas of the heated object pass through the position right under the ring of lamps with local maximum irradiance, and then pass through a position between two adjacent rings of lamps with local minimum irradiance;

wherein the number of the subsets of the heating lamps is 6, including a most inner subset with single one of the heating lamps at the lamp center;

wherein the subsets of the heating lamps are arranged into a plurality of concentric rings with intervals between the concentric rings being arranged in a ratio of 4/3: 1.5:2:2:2 from the most inner subset.

8. The thermal processing as recited in claim 7, wherein an offset distance of the offset is denoted as e and the concentric rings of the subsets of the heating lamps comprise a first ring, a second ring, a third ring, a fourth ring, a fifth ring and a sixth ring, in which the interval between the first ring and the second ring is L1=4e/3, the interval between the second ring and the third ring is L2=1.5e, the interval between the third ring and the fourth ring is L3=2e, the interval between the fourth ring and the fifth ring is L4=2e, and the interval between the fifth ring and the sixth ring is L5=2e.

9. The adjusting technology of thermal processing as recited in claim 8, wherein a diameter of the heated object is denoted by D, and the offset distance e is calculated by:

$$D/2 = \sum_{i=1}^{5} Li - e - X,$$

wherein the X is a constant indicating an unintended region of the heated object at a brim region.

10. The thermal processing as recited in claim 9, wherein the value of X is 0.3 cm, and the value of D is 30 cm.

11. The thermal processing as recited in claim 6, wherein an angle of the offset away from a reference direction is 150°.

12. A thermal processing method comprising:

disposing a heated object on a supporter, wherein the heated object is an object to be heated and has an object center;

disposing a set of heating lamps formed by a plurality of heating lamps over the heated object, wherein the heating lamps are arranged into an axi-symmetric array with a plurality of subsets of the heating lamps, wherein the set of the heating lamps has a lamp center, wherein the object center and the lamp center are shifted by an offset e such that the object center is at a position with local mean heat flux from lamps between a most inner lamp subset and its adjacent lamp subset;

applying heating power to the heating lamps for heating the heated object, wherein an individual one of the same subset of the heating lamps is applied with the same heating power; and performing a relative rotation between the heated object and the set of the heating lamps, wherein the relative rotation is eccentric and caused from the offset between the object center and the lamp centersuch that local areas of the heated object pass through the position right under the ring of lamps with local maximum irradiance, and then pass though a position between two adjacent rings of lamps with local minimum irradiance;

wherein the number of the subsets of the heating lamps is 6, including a most inner subset with single one of the heating lamps at the lamp center;

wherein the heating powers for the subsets of the heating lamps are in a ratio of 31:36:57:71:65:99.

13. The thermal processing as recited in claim 1, wherein the number of the subsets of the heating lamps is n, and wherein a single heating lamp serves as an innermost subset at the lamp center.

14. A thermal processing method comprising:

disposing a heated object on a supporter, wherein the heated object is an object to be heated and has an object center;

disposing a set of heating lamps formed by a plurality of heating lamps over the heated object, wherein the heating lamps are arranged into an axi-symmetric array with a plurality of subsets of the heating lamps, wherein the set of the heating lamps has a lamp center, wherein the object center and the lamp center are shifted by an offset e such that the object center is at a position with local mean heat flux from lamps between a most inner lamp subset and its adjacent lamp subset;

applying heating power to the heating lamps for heating the heated object, wherein an individual one of the same subset of the heating lamps is applied with the same heating power; and performing a relative rotation between the heated object and the set of the heating lamps, wherein the relative rotation is eccentric and caused from the offset between the object center and the lamp centersuch that local areas of the heated object pass through the position right under the ring of lamps with local maximum irradiance, and then pass through a position between two adjacent rings of lamps with local minimum irradiance;

wherein the number of the subsets of the heating lamps is n, and wherein a single heating lamp serves as an innermost subset at the lamp center;

wherein the subsets of the heating lamps are arranged into a plurality of concentric rings with intervals $L_i$ between e and 2e.

15. The thermal processing apparatus as recited in claim 14, wherein a diameter of the heated object is denoted by D, and the offset distance e is calculated by:

$$D/2 = \sum_{i=1}^{5} Li - e - X.$$

wherein the X is a constant indicating an unintended region of the heated object at a brim region.

16. The thermal processing as recited in claim 1, wherein a first pair of adjacent concentric rings is different in radial spacing from a second pair of adjacent concentric rings.

17. The thermal processing as recited in claim 1, wherein the heating lamps in at least one of the concentric rings are actuated at a different heating power than the heating lamps in another of the concentric rings radially spaced therefrom.

* * * * *